(12) United States Patent
Akamatsu et al.

(10) Patent No.: US 12,439,670 B2
(45) Date of Patent: Oct. 7, 2025

(54) SEMICONDUCTOR DEVICE AND METHOD OF MANUFACTURING THE SAME

(71) Applicant: DENSO CORPORATION, Kariya (JP)

(72) Inventors: Kazuo Akamatsu, Kariya (JP); Tsuyoshi Fujiwara, Kariya (JP)

(73) Assignee: DENSO CORPORATION, Kariya (JP)

( * ) Notice: Subject to any disclaimer, the term of this patent is extended or adjusted under 35 U.S.C. 154(b) by 423 days.

(21) Appl. No.: 18/067,858

(22) Filed: Dec. 19, 2022

(65) Prior Publication Data

US 2023/0121589 A1 Apr. 20, 2023

Related U.S. Application Data

(63) Continuation of application No. PCT/JP2021/023792, filed on Jun. 23, 2021.

(30) Foreign Application Priority Data

Jun. 26, 2020 (JP) ................................. 2020-110887

(51) Int. Cl.
*H10D 64/01* (2025.01)
*H10D 30/01* (2025.01)
*H10D 30/66* (2025.01)
*H10D 62/83* (2025.01)
*H10D 64/23* (2025.01)
*H10D 64/62* (2025.01)

(52) U.S. Cl.
CPC ....... *H10D 64/252* (2025.01); *H10D 30/0297* (2025.01); *H10D 30/668* (2025.01); *H10D 62/83* (2025.01); *H10D 64/01* (2025.01); *H10D 64/62* (2025.01)

(58) Field of Classification Search
CPC ...... H10D 64/01; H10D 64/252; H10D 64/62; H10D 30/0297; H10D 30/668; H10D 62/83
USPC ......................................................... 257/288
See application file for complete search history.

(56) References Cited

U.S. PATENT DOCUMENTS 5,668,411 A * 9/1997 Hong ................. H01L 21/76876
438/653
2001/0024852 A1* 9/2001 Aoki ................. H01L 21/02052
257/E21.309

(Continued)

FOREIGN PATENT DOCUMENTS

JP    S61-127149 A    6/1986
JP    2019-192687 A   10/2019

*Primary Examiner* — Monica D Harrison
(74) *Attorney, Agent, or Firm* — Posz Law Group, PLC

(57) ABSTRACT

A semiconductor device includes a semiconductor substrate and an electrode. The electrode is electrically connected to the semiconductor substrate and located on the semiconductor substrate. The electrode has a lower metal layer, an upper metal layer and an intermediate layer. The lower metal layer is located at a side closer to the semiconductor substrate. The upper metal layer is located above the lower metal layer. The intermediate layer is located between the lower metal layer and the upper metal layer. Each of the lower metal layer and the upper metal layer is made of aluminum or an aluminum alloy. In the aluminum alloy, an element is added to aluminum. The intermediate layer is made of material that is more difficult to react with a hydroxyl group than the lower metal layer and the upper metal layer.

5 Claims, 4 Drawing Sheets

(56) References Cited

U.S. PATENT DOCUMENTS

| | | | |
|---|---|---|---|
| 2001/0041440 A1 | 11/2001 | Endo et al. | |
| 2009/0133782 A1 | 5/2009 | Uchida et al. | |
| 2012/0058276 A1 | 3/2012 | Uchida et al. | |
| 2017/0222009 A1 | 8/2017 | Hikasa et al. | |
| 2018/0315826 A1 | 11/2018 | Hikasa et al. | |
| 2019/0067225 A1 | 2/2019 | Tonegawa et al. | |
| 2021/0225789 A1 * | 7/2021 | Tonegawa et al. | |
| 2022/0037523 A1 * | 2/2022 | Oda | H10D 30/668 |

* cited by examiner

SEMICONDUCTOR DEVICE AND METHOD OF MANUFACTURING THE SAME

CROSS REFERENCE TO RELATED APPLICATIONS

The present application is a continuation application of International Patent Application No. PCT/JP2021/023792 filed on Jun. 23, 2021, which designated the U.S. and claims the benefit of priority from Japanese Patent Application No. 2020-110887 filed on Jun. 26, 2020. The entire disclosures of all of the above applications are incorporated herein by reference.

TECHNICAL FIELD

The present disclosure relates to a semiconductor device and a method of manufacturing the semiconductor device.

BACKGROUND

A semiconductor device may have a semiconductor substrate and an electrode located on the semiconductor substrate and connected to the semiconductor substrate.

SUMMARY

The present disclosure describes a semiconductor device having a semiconductor substrate and an electrode located on the semiconductor substrate and connected to the semiconductor substrate, and further describes a method of manufacturing the semiconductor device.

BRIEF DESCRIPTION OF DRAWINGS

Objects, features and advantages of the present disclosure will become more apparent from the following detailed description made with reference to the accompanying drawings. In the drawings.

DETAILED DESCRIPTION

Figure 1:
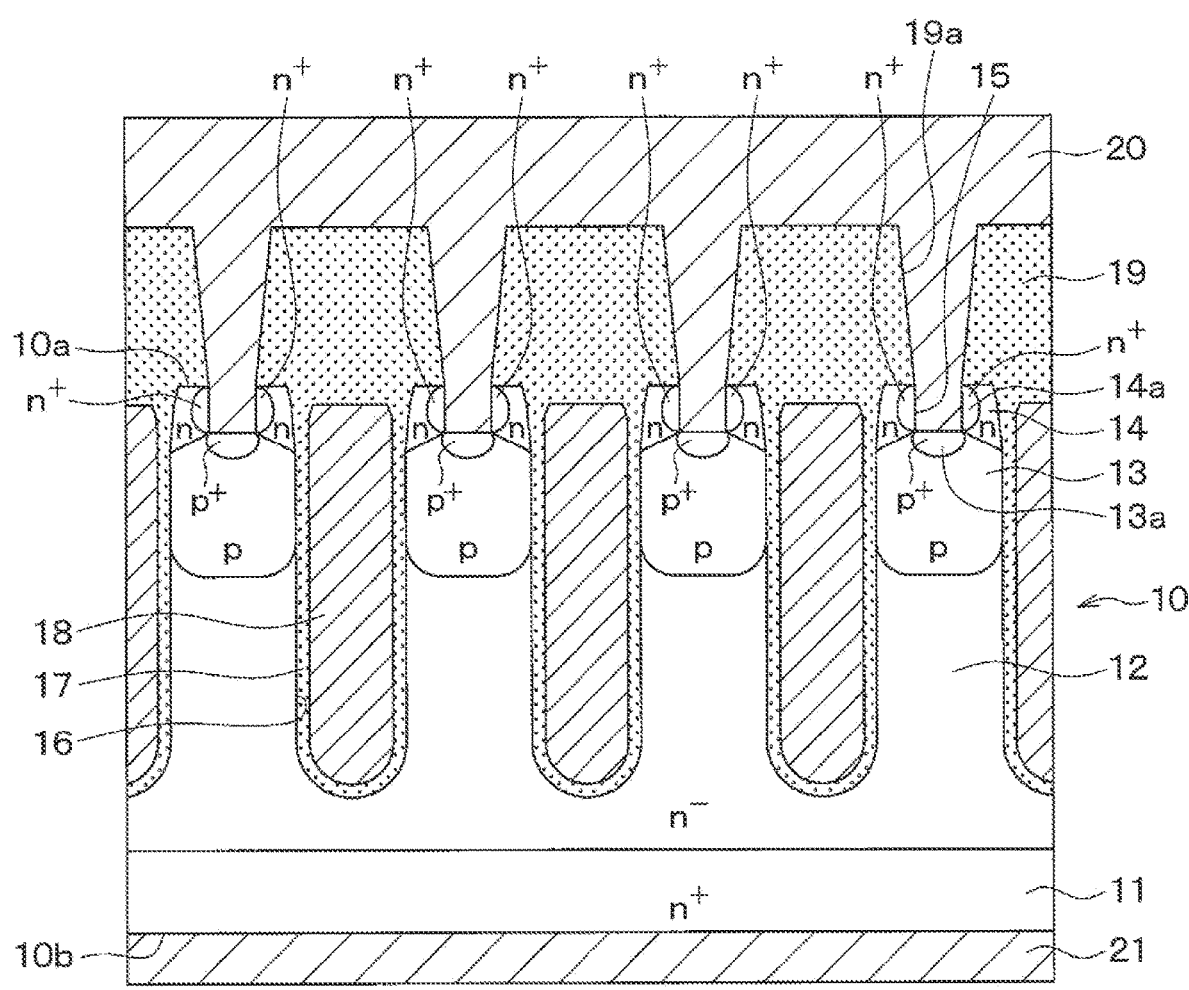
FIG. 1 is a cross-sectional view of a semiconductor device according to a first embodiment.

A semiconductor device may include a metal oxide semiconductor field effect transistor (MOSFET) having, for example, a channel layer and a source layer at a first surface of the semiconductor substrate and having, for example, a drain layer at a second surface of the semiconductor substrate. The semiconductor device may include a first electrode and a second electrode. The first electrode may be connected to the channel layer and the source layer at the first surface of the semiconductor, and the second electrode may be connected to the drain layer at the second surface of the semiconductor substrate. In such a semiconductor device, the first electrode side is connected to a connection member through, for example, solder. For example, an electroless nickel plating film having a relatively high joint property with the solder may be arranged on the first electrode. The first electrode may be made of aluminum or an aluminum alloy in which an element is added to the aluminum.

In a case where the electroless film is arranged on the first electrode, a zincate treatment may be conducted for the first electrode in order to enhance the adhesion between the electroless nickel plating film and the first electrode. However, in a case where the first electrode is made of the aluminum or the aluminum alloy, the first electrode may be reacted with a hydroxyl group contained in an alkaline solution during the zincate treatment and then the first electrode may be corroded. In a case where the corrosion is enlarged, the adhesion between the electroless nickel plating film and the first electrode may be lowered, and the interface strength between the electroless nickel plating film and the first electrode may also be lowered.

According to a first aspect of the present disclosure, a semiconductor device includes a semiconductor substrate and an electrode. The electrode is electrically connected to the semiconductor substrate and located on the semiconductor substrate. The electrode has a lower metal layer, an upper metal layer and an intermediate layer. The lower metal layer is located at a side closer to the semiconductor substrate. The upper metal layer is located above the lower metal layer. The intermediate layer is located between the lower metal layer and the upper metal layer. Each of the lower metal layer and the upper metal layer is made of aluminum or an aluminum alloy. In the aluminum alloy, an element is added to aluminum. The intermediate layer is made of material that is more difficult to react with a hydroxyl group than the lower metal layer and the upper metal layer.

Since the intermediate layer is made of the material that is difficult to react with the hydroxyl group, the progression of the corrosion can be inhibited by the intermediate layer even though the upper metal layer is corroded at the time of conducting the zincate treatment. Thus, it is possible to inhibit the enlargement of the corrosion. It is possible to inhibit the lowering of the interface strength between the electroless nickel plating film and the electrode at the time of subsequently forming the electroless nickel plating film.

According to a second aspect of the present disclosure, a method of manufacturing a semiconductor device includes preparation of a semiconductor substrate and arrangement of an electrode. The electrode is electrically connected to the semiconductor substrate and arranged on the semiconductor substrate. The arrangement of the electrode includes arrangement of a lower metal layer above the semiconductor substrate, arrangement of an intermediate layer on the lower metal layer, and arrangement of an upper metal layer on the intermediate layer. In the arrangement of the upper metal layer and the arrangement of the lower metal layer, each of the upper metal layer and the lower metal layer is formed with aluminum or an aluminum alloy. In the aluminum alloy, an element is added to aluminum. In the arrangement of the intermediate layer, the intermediate layer is formed with material that is more difficult to react with a hydroxyl group than the upper metal layer and the lower metal layer.

Accordingly, the intermediate layer is made of the material that is difficult to react with the hydroxyl group. Therefore, it is possible to inhibit the enlargement of corrosion at the time of conducting the zincate treatment. It is possible to manufacture the semiconductor device that can inhibit the lowering of the interface strength between the electroless nickel plating film and the electrode at the time of subsequently forming the electroless nickel plating film.

The following describes multiple embodiments with reference to the drawings. Hereinafter, in the respective embodiments, substantially the same configurations are denoted by identical symbols, and repetitive description will be omitted.

First Embodiment

The following describes a first embodiment. The present embodiment describes a semiconductor device having an n-channel vertical power MOSFET. The following describes the structure of the semiconductor device according to the present with reference to FIG. 1.

The semiconductor device includes a semiconductor substrate 10 having a drain layer 11 and formed of an n$^+$-type silicon (Si) substrate. An n$^-$-type drift layer 12 is arranged on the drain layer 11. In the following, the n$^-$-type drift layer 12 may be also simply referred to as a drift layer 12. The drift layer 12 has a lower impurity concentration than the drain layer 11. A p-type channel layer 13 is arranged on the drift layer 12. In the following, the p-type channel layer 13 may be also simply referred to as a channel layer 13. The channel layer 13 has a higher impurity concentration than the drift layer 12.

An n-type source layer 14 is formed at a surface layer portion of the channel layer 13. In the following, the n-type source layer 14 may be also simply referred to as a source layer 14. The source layer 14 has a higher impurity concentration than the drift layer 12. A contact trench 15 is formed at the semiconductor substrate 10 to penetrate the source layer 14 and reach the channel layer 13. Therefore, the channel layer 13 is exposed at the bottom surface of the contact trench 15.

In the present embodiment, at the portion of the channel layer 13 exposed from the contact trench 15, a contact region 13a for the p$^+$-type channel layer that serves as a contact is formed. At a portion of the source layer 14 exposed from the side surface of the contact trench 15, a contact region 14a for the n$^+$-type source layer that serves as a contact is formed.

Multiple trenches 16 are formed between the channel layer 13 and the source layer 14 at the semiconductor substrate 10. The multiple trenches 16 are formed in stripes at equal intervals in one direction (that is, a direction perpendicular to a paper plane of FIG. 1) in a planar direction of a first surface 10a of the semiconductor substrate 10, and penetrate the channel layer 13 to reach the drift layer 12. The multiple trenches 16 may have an annular structure by bending tip portions thereof.

Each of the trenches 16 is embedded with a gate insulation film 17 and a gate electrode 18. The gate insulation film 17 covers a wall surface of each of the trenches 16. The gate electrode 18 is formed of polysilicon or the like and is formed on the gate insulation film 17. Accordingly, the trench gate structure is formed.

An interlayer insulation film 19 is formed on the first surface 10a of the semiconductor substrate 10 near the channel layer 13, and a contact hole 19a communicating with the contact trench 15 is formed at the interlayer insulation film 19. On the interlayer insulation film 19, an upper electrode 20 is formed. The upper electrode 20 is electrically connected to the contact region 14a for the source layer and the contact region 13a for the channel layer through the contact hole 19a formed at the interlayer insulation film 19 and the contact trench 15 formed at the semiconductor substrate 10. The structure of the upper electrode 20 will be described hereinafter.

A drain electrode 21 that is electrically connected to the drain layer 11 is formed on a second surface 10b of the semiconductor substrate 10.

The structure of the semiconductor device according to the present embodiment is described above. In the present embodiment, n$^-$-type, n-type, and n$^+$-type correspond to the first conductivity type, and p-type and p$^+$-type correspond to the second conductivity type. In the present embodiment, as described above, the semiconductor substrate 10 includes, for example, the drain layer 11, the drift layer 12, the channel layer 13, and the source layer 14.

Figure 2:
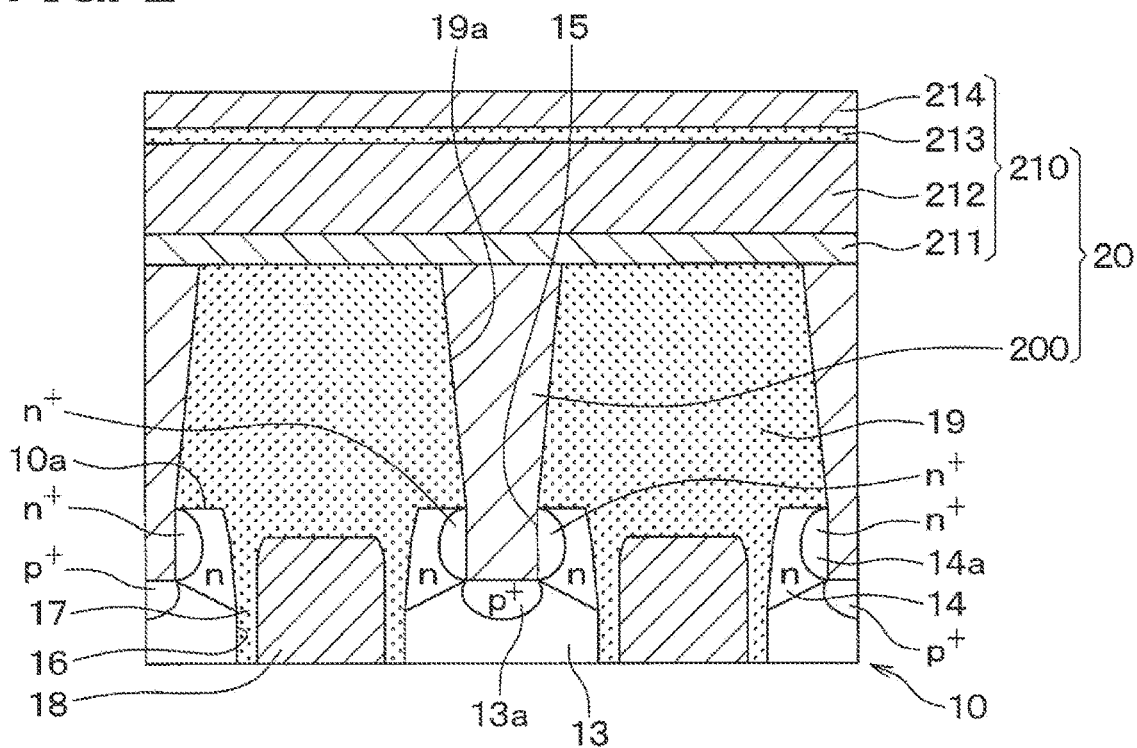
FIG. 2 is an enlarged view of the vicinity of an upper electrode.

The following describes the structure of the upper electrode 20 according to the present embodiment. As illustrated in FIG. 2, the upper electrode 20 according to the present embodiment has an embedded portion 200. The embedded portion 200 is arranged at the contact hole 19a and the contact trench 15 and connected to the contact region 13a for the channel layer and the contact region 14a for the source layer. The upper electrode 20 includes a main portion 210 arranged on the interlayer insulation film 19 and connected to the embedded portion 200.

The embedded portion 200 is made of, for example, a tungsten plug. Although not particularly shown, a ground layer may be formed at the wall surface of each of the contact hole 19a and the contact trench 15 for enhancing the embedding property of tungsten. The ground layer is made of, for example, titanium or titanium nitride.

The main portion 210 is formed by stacking a barrier metal layer 211, a lower metal layer 212, an intermediate layer 213 and an upper metal layer 214. The barrier metal layer 211 is formed by stacking, for example, titanium nitride and titanium.

Each of the lower metal layer 212 and the upper metal layer 214 are made of aluminum or an aluminum alloy in which an element is added to the aluminum. The aluminum alloy may be, for example, an aluminum-silicon (AlSi) alloy, an aluminum-copper (AlCu) alloy and an aluminum-silicon-copper (AlSiCu) alloy. The intermediate layer 213 is made of material that is more difficult to react with the hydroxyl group than the lower metal layer 212 and the upper metal layer 214. In the present embodiment, the intermediate layer 213 is formed at the entire surface between the lower metal layer 212 and the upper metal layer 214, and has a substantially constant thickness along the planar direction of the semiconductor substrate 10.

In the present embodiment, the intermediate layer 213 is arranged closer to the upper metal layer 214 than the center of the main portion 210 in a stacking direction of the lower metal layer 212, the intermediate layer 213 and the upper metal layer 214. In the following, the stacking direction of the lower metal layer 212, the intermediate layer 213 and the upper metal layer 214 is simply referred to as a stacking direction. In the present embodiment, the intermediate layer 213 is made of an ultra-thin film in a range of 2 nanometers (nm) to 10 nanometers (nm).

The structure of the semiconductor device according to the present embodiment has been described above. In such a semiconductor device, the electroless nickel plating film is formed on the upper electrode 20 after the zincate treatment is conducted on the upper electrode 20, the solder or the like is arranged on the electroless nickel plating film and electrically connected to an external element.

Figure 3:
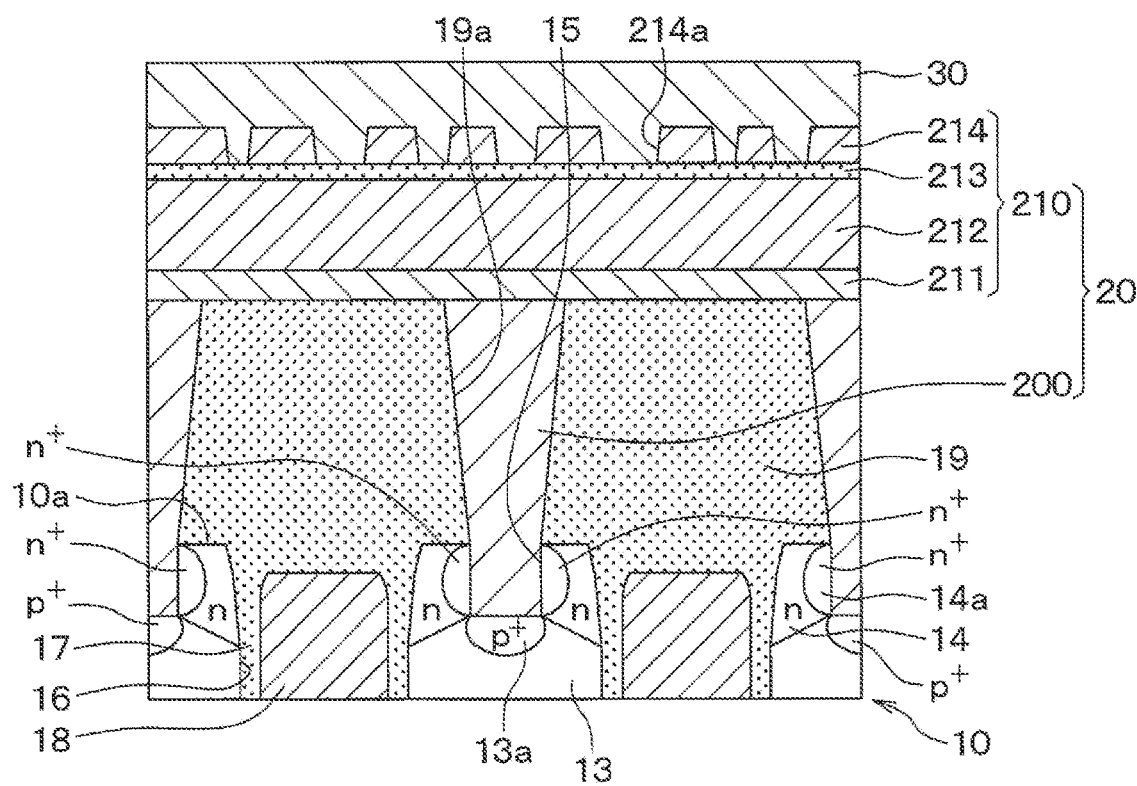
FIG. 3 is an enlarged view of the vicinity of the upper electrode at the time of conducting a zincate treatment.

At this time, the upper electrode 20 according to the present embodiment are formed by stacking the lower metal layer 212, the intermediate layer 213 and the upper metal layer 214. The intermediate layer 213 made of material that is more difficult to react with the hydroxyl group than the upper metal layer 214 and the lower metal layer 212. At the time of conducting the zincate treatment, as illustrated in FIG. 3, even though the upper metal layer 214 is corroded and a hole 214a is formed at the upper metal layer 214, the progression of the hole 214a, in other words, the corrosion can be inhibited by the intermediate layer 213. Therefore, it is possible to suppress the progression of the corrosion. Therefore, when an electroless nickel plating film 30 is formed subsequently, it is possible to inhibit a decrease in the strength of adhesion between the electroless nickel plating film 30 and the upper electrode 20.

The following describes a method of manufacturing the upper electrode 20 of the semiconductor device according to the present embodiment.

Figure 4A:
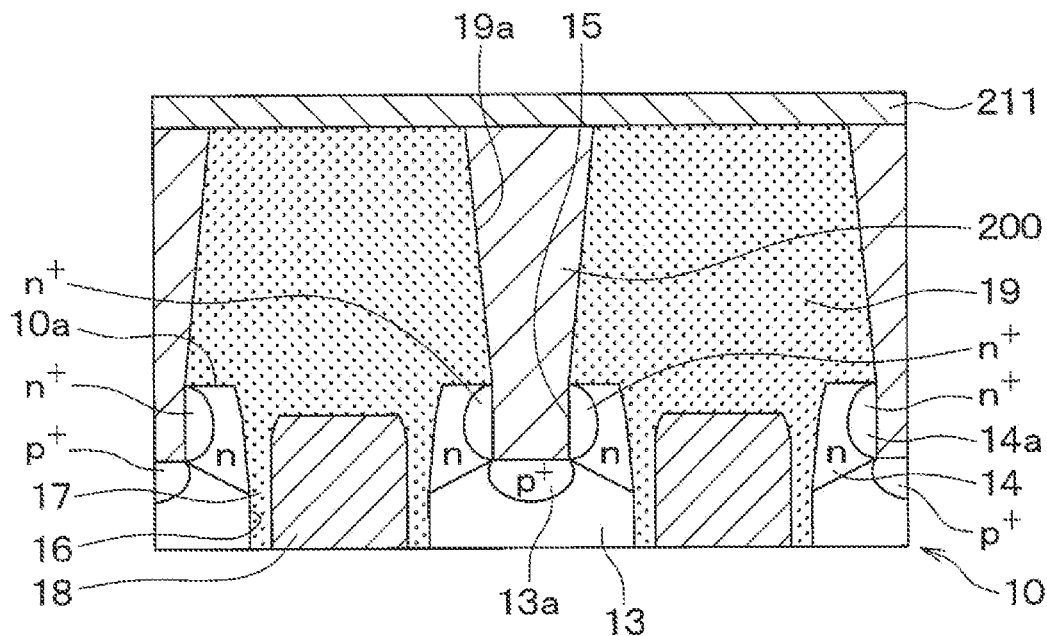
FIG. 4A is a sectional view illustrating a manufacturing process of the semiconductor device shown in FIG. 1.

As illustrated in FIG. 4A, for example, the channel layer 13, the source layer 14 and the interlayer insulation film 19 are formed, and the embedded portion 200 of the upper electrode 20 is prepared. Subsequently, for example, titanium nitride and titanium are respectively formed as films in order to form the barrier metal layer 211 through a chemical vapor deposition (CVD) method.

Figure 4B:
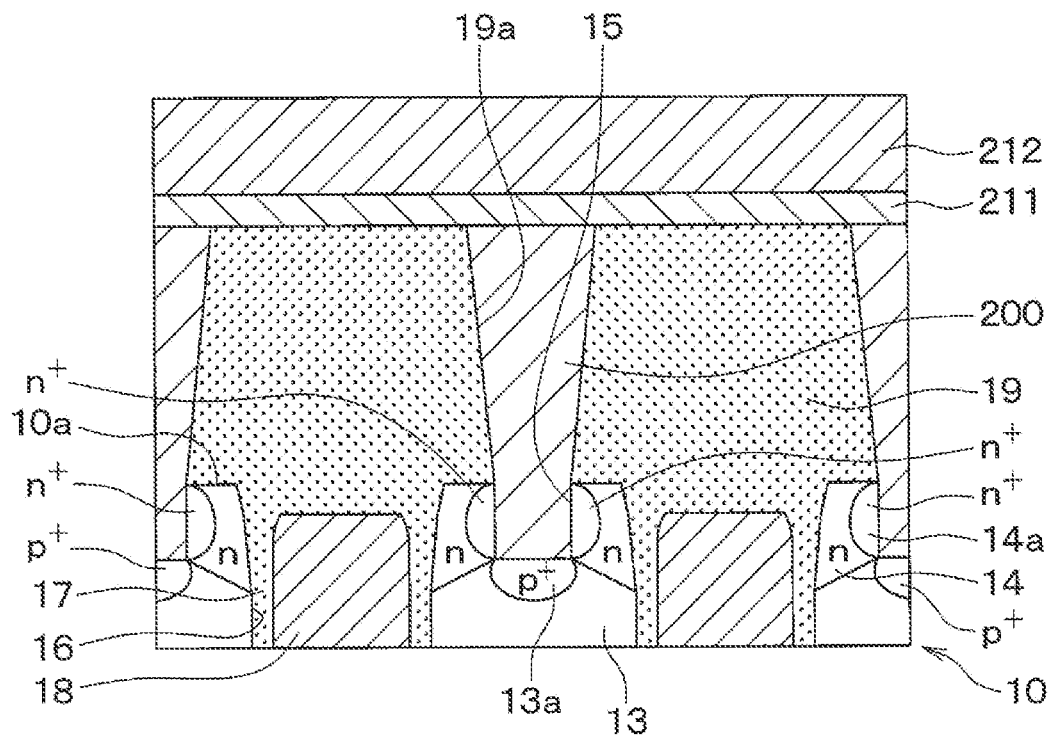
FIG. 4B is a sectional view illustrating the manufacturing process of the semiconductor device subsequent to FIG. 4A.
Figure 4C:
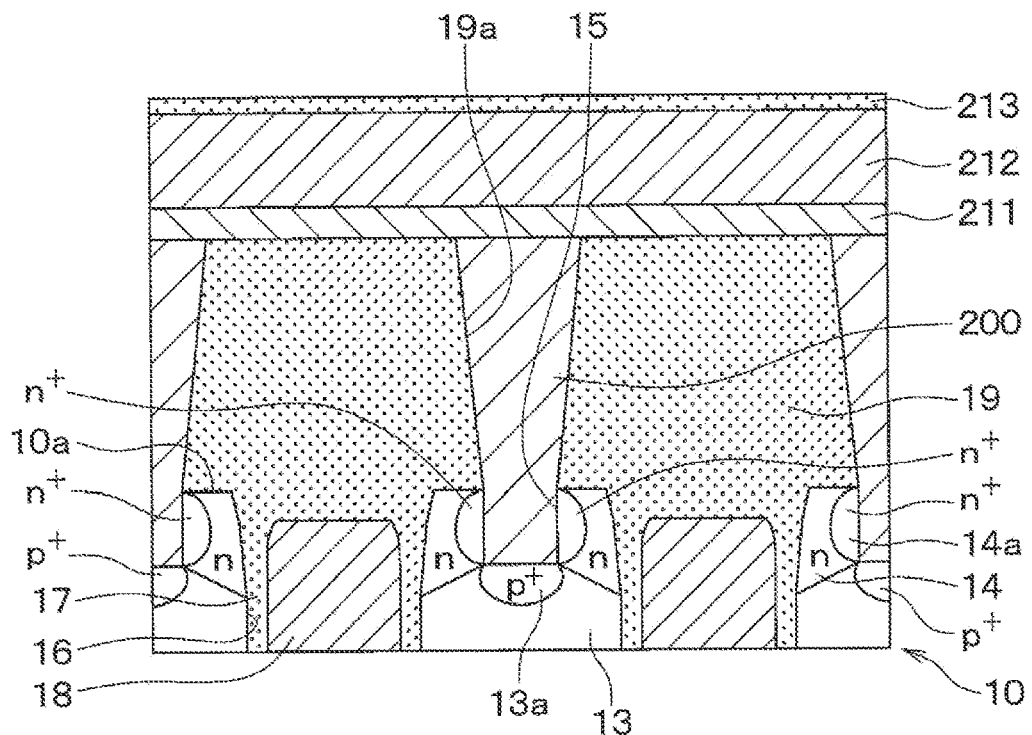
FIG. 4C is a cross-sectional view illustrating a manufacturing process of the semiconductor device subsequent to FIG. 4B.

As illustrated in FIG. 4B, the semiconductor substrate 10 is arranged in a sputtering apparatus, and the lower metal layer 212 is formed by sputtering. As illustrated in FIG. 4C, the semiconductor substrate 10 is removed from a sputtering apparatus and is exposed to atmosphere to form an intermediate layer 213 made of an aluminum oxide film. At this time, in the present embodiment, scrubber cleaning is conducted while vibrating the semiconductor substrate 10 through an ultrasonic wave. In the scrubber cleaning, brush cleaning is conducted while ultrapure water is jetted onto the surface of the lower metal layer 212. As a result, foreign matter and whiskers that may be contained in the surface of the lower metal layer 212 and the intermediate layer 213 can be removed.

Figure 4D:
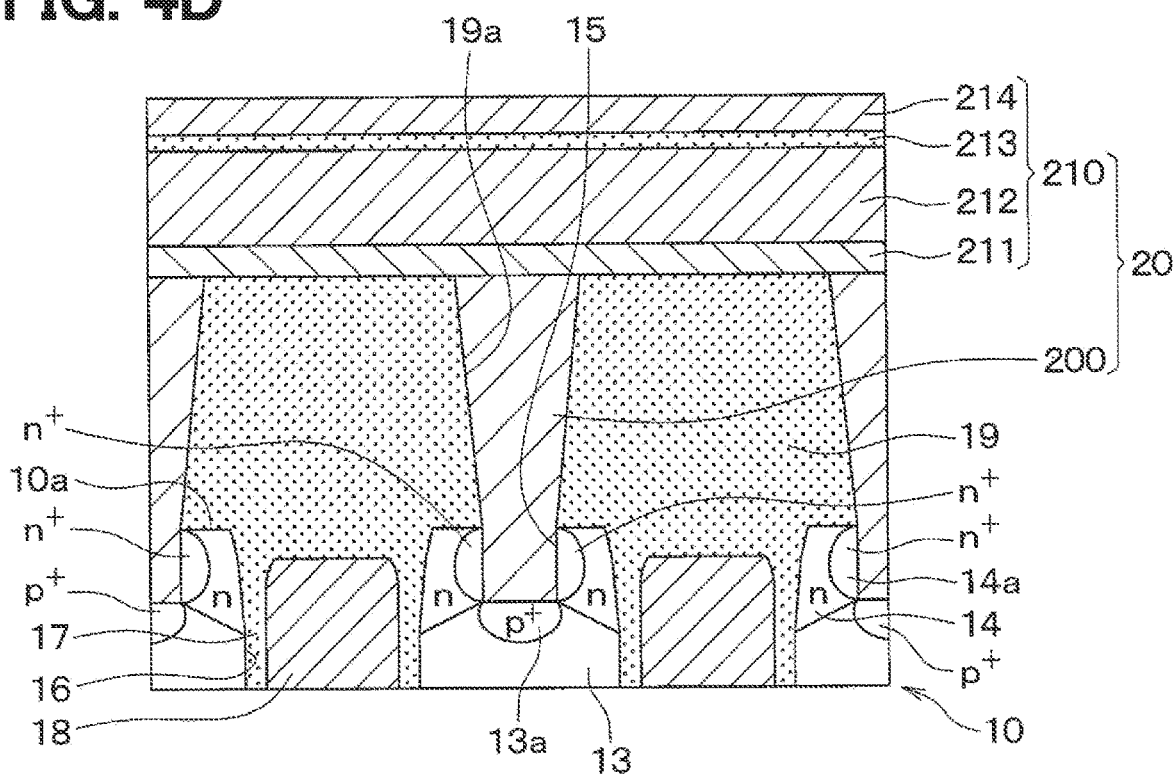
FIG. 4D is a cross-sectional view illustrating a manufacturing process of the semiconductor device subsequent to FIG. 4C.

As illustrated in FIG. 4D, the semiconductor substrate 10 is again arranged in the sputtering apparatus, and the upper metal layer 214 is formed by the sputtering. The upper electrode 20 is formed as described above.

According to the present embodiment, the upper electrode 20 is formed by stacking the lower metal layer 212, the intermediate layer 213 and the upper metal layer 214. The intermediate layer 213 made of material that is more difficult to react with the hydroxyl group than the upper metal layer 214 and the lower metal layer 212. Therefore, even though the upper metal layer 214 is corroded during the zincate treatment, the progression of the corrosion may be inhibited by the intermediate layer 213. Therefore, it is possible to suppress the progression of the corrosion. Therefore, when the electroless nickel plating film 30 is formed subsequently, it is possible to inhibit a decrease in the strength of interface between the electroless nickel plating film 30 and the upper electrode 20.

In the present embodiment, the intermediate layer 213 is arranged closer to the upper metal layer 214 than the center of the upper electrode 20 in the stacking direction. As compared with a situation in which the intermediate layer 213 is located closer to the lower metal layer 212 than the center of the upper electrode 20 in the stacking direction, it is possible to inhibit the progression of the corrosion at an early stage when the upper metal layer 214 is corroded. Therefore, it is possible to inhibit the progression of corrosion.

In the present embodiment, the intermediate layer 213 is easily manufactured since the intermediate layer 213 is formed by exposing the intermediate layer 213 to the atmosphere. At the time of forming the intermediate layer 213, the scrubber cleaning is conducted. Therefore, foreign matter and whiskers that may be contained in the surface of the lower metal layer 212 and the intermediate layer 213 can be removed.

Other Embodiments

Although the present disclosure has been described in accordance with the embodiments, it is understood that the present disclosure is not limited to such embodiments or structures. The present disclosure encompasses various modifications and variations within the scope of equivalents. In addition, various combinations and configurations, as well as other combinations and configurations that include only one element, more, or less, are within the scope and spirit of the present disclosure.

For example, in the first embodiment, the gate electrode 18 may include a double gate structure including a lower layer electrode and an upper layer electrode in the thickness direction of the semiconductor substrate 10. In this case, the lower layer electrode is, for example, a shield electrode connected to the source electrode or the like, and the upper electrode is a gate electrode connected to a gate drive circuit or the like.

In the first embodiment, the intermediate layer 213 may be formed with an aluminum oxide film. For example, the intermediate layer 213 may be formed by stacking a silicon oxide film ($SiO_2$) and a silicon nitride film (SiN). In a case of such a semiconductor device, for example, in the process illustrated in FIG. 4C, the intermediate layer 213 may be formed by stacking the silicon oxide film and the silicon nitride film in order through the CVD method or the like. The intermediate layer 213 may be made of one of the silicon oxide film and the silicon nitride film. In the first embodiment, the intermediate layer 213 may be formed with, for example, an aluminum nitride film. In a case of such a semiconductor device, for example, in the process illustrated in FIG. 4C, reactive sputtering of nitrogen and aluminum may be conducted to form the intermediate layer 213 made of the aluminum nitride film. Even if the intermediate layer 213 is formed as described above, the scrubber cleaning may be conducted for the lower metal layer 212 before the formation of the intermediate layer 213. As a result, foreign substances and whiskers can be removed in the same manner as in the first embodiment.

The first embodiment describes that the intermediate layer 213 is arranged at an entire region between the lower metal layer 212 and the upper metal layer 214. However, the intermediate layer 213 may be arranged at least a portion of the entire region between the lower metal layer 212 and the upper metal layer 214. Even in such a semiconductor device, in a portion where the intermediate layer 213 is formed, since it is possible to inhibit the progression of the corrosion at the time of conducting the zincate treatment, it is possible to attain the effect identical to the one in the first embodiment. The thickness of the intermediate layer may not have to be constant along the surface direction of the semiconductor substrate 10.

Further, in the first embodiment, instead of the trench gate type semiconductor device, a planar gate type semiconductor device in which the gate electrode 18 is disposed on the semiconductor substrate 10 may be used.

In the first embodiment described above, the MOSFET of the n-channel type trench gate structure in which the first conductivity type is n-type and the second conductivity type is p-type has been described as an example of the semiconductor device. However, this is merely an example, and a semiconductor device of another structure, for example, a MOSFET of a trench gate structure of a p-channel type in which the conductivity type of each component is inverted with respect to the n channel type may also be used. Other than the MOSFET, the semiconductor device may be formed with an IGBT with a similar structure. In the case of IGBT, the $n^+$-type drain layer 11 in the first embodiments is replaced by a $p^+$-type collector layer. Other than that, the IGBT is similar to the MOSFET as described in the first embodiment. In the first embodiment, for example, a diode may also be formed in the semiconductor device.

What is claimed is:

1. A semiconductor device comprising:
   a semiconductor substrate;
   an interlayer insulation film located on the semiconductor substrate, the interlayer insulation film having a contact hole; and
   an electrode located on the semiconductor substrate, the electrode electrically connected to the semiconductor substrate through the contact hole,
   wherein the electrode includes:
      an embedded portion located at the contact hole;
      a lower metal layer located above the interlayer insulation film at a side closer to the semiconductor substrate and electrically connected to the embedded portion;
      an upper metal layer located above the lower metal layer; and
      an intermediate layer located between the lower metal layer and the upper metal layer,
   wherein each of the lower metal layer and the upper metal layer is made of aluminum or an aluminum alloy in which an element is added to aluminum,
   wherein the intermediate layer is made of material that is more difficult to react with a hydroxyl group than the upper metal layer and the lower metal layer,
   wherein the intermediate layer is configured such that a distance between the semiconductor substrate and the intermediate layer is constant along a planar direction of the semiconductor substrate, and
   wherein the embedded portion is made of a tungsten plug.

2. The semiconductor device according to claim 1,
   wherein the electrode includes a part in which the lower metal layer, the intermediate layer, and the upper metal layer are stacked in a stacking direction, and
   wherein the intermediate layer is located closer to the upper metal layer than a center of the part of the electrode in the stacking direction.

3. The semiconductor device according to claim 1,
   wherein the intermediate layer is a film selected from a group consisting of
      an aluminum oxide film,
      a stacking film in which a silicon oxide film and a silicon nitride film are stacked,
      a silicon oxide film,
      a silicon nitride film, and
      an aluminum nitride film.

4. A method of manufacturing a semiconductor device, the method comprising:
   preparing a semiconductor substrate;
   arranging an interlayer insulation film on the semiconductor substrate, the interlayer insulation film formed with a contact hole; and
   arranging an electrode on the semiconductor substrate,
   wherein the arranging of the electrode includes:
      arranging an embedded portion at the contact hole;
      arranging a lower metal layer above the interlayer insulation film, the lower metal layer electrically connected to the embedded portion;
      arranging an intermediate layer on the lower metal layer; and
      arranging an upper metal layer on the intermediate layer,
   wherein, in the arranging of the embedded portion, the embedded portion is formed with a tungsten plug,
   wherein, in the arranging of the lower metal layer and in the arranging of the upper metal layer, each of the lower metal layer and the upper metal layer is formed with aluminum or an aluminum alloy in which an element is added to aluminum, and
   wherein, in the arranging of the intermediate layer, the intermediate layer is formed with material that is more difficult to react with a hydroxyl group than the upper metal layer and the lower metal layer, and the intermediate layer is formed such that a distance between the semiconductor substrate and the intermediate layer is constant along a planar direction of the semiconductor substrate.

5. The method according to claim 4,
   wherein, in the arranging of the lower metal layer, the lower metal layer is formed by sputtering, and
   wherein, in the arranging of the intermediate layer, the intermediate layer is treated with scrubber cleaning.

* * * * *